United States Patent
Kuo et al.

(10) Patent No.: US 12,408,457 B2
(45) Date of Patent: Sep. 2, 2025

(54) IMAGE SENSING DEVICE WITH MULTIPLE OPTICAL LAYERS FORMED ON MICRO LENS

(71) Applicant: VisEra Technologies Company Limited, Hsin-Chu (TW)

(72) Inventors: Shin-Hong Kuo, New Taipei (TW); Yu-Chi Chang, Hsinchu County (TW); Zong-Ru Tu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 658 days.

(21) Appl. No.: 17/071,673

(22) Filed: Oct. 15, 2020

(65) Prior Publication Data
US 2022/0123037 A1    Apr. 21, 2022

(51) Int. Cl.
*H10F 39/00*    (2025.01)

(52) U.S. Cl.
CPC ....... *H10F 39/806* (2025.01); *H10F 39/8063* (2025.01); *H10F 39/8053* (2025.01)

(58) Field of Classification Search
CPC ......... H01L 27/14625; H01L 27/14627; H01L 27/14621; H01L 27/14685; G02B 3/08; G02B 1/11; H10F 39/806; H10F 39/8063; H10F 39/8053; H10F 39/024; H10F 39/805
See application file for complete search history.

(56) References Cited

U.S. PATENT DOCUMENTS

| | | | |
|---|---|---|---|
| 6,738,171 B1 * | 5/2004 | Campbell | G02B 5/203 349/95 |
| 8,648,771 B2 * | 2/2014 | Hwu | G02B 27/0972 345/1.3 |
| 2007/0030380 A1 * | 2/2007 | Higuchi | H01L 27/14687 348/340 |
| 2008/0023624 A1 * | 1/2008 | Moon | H01L 27/14625 257/E31.127 |
| 2018/0074323 A1 * | 3/2018 | Wheelwright | G02B 3/08 |
| 2021/0134857 A1 * | 5/2021 | Tang | H01L 27/1462 |

(Continued)

FOREIGN PATENT DOCUMENTS

| | | |
|---|---|---|
| TW | I-252327 B | 4/2006 |
| TW | I-264580 B | 10/2006 |
| TW | I-500145 B | 9/2015 |

(Continued)

OTHER PUBLICATIONS

Office Action mailed Oct. 27, 2021 in TW Application No. 110104019 is attached, 6 pages.

*Primary Examiner* — Georgia Y Epps
*Assistant Examiner* — Erin R Garber
(74) *Attorney, Agent, or Firm* — Muncy, Geissler, Olds & Lowe, P.C.

(57) ABSTRACT

An image sensing device is provided. The image sensing device includes: a micro lens, a first optical layer, a second optical layer, and an anti-reflection layer. The first optical layer is formed on the micro lens. The second optical layer is formed on the first optical layer. An interface is formed between the first optical layer and the second optical layer, and the interface is beveled. The anti-reflection layer is formed on the second optical layer.

20 Claims, 13 Drawing Sheets

(56) References Cited

U.S. PATENT DOCUMENTS

2021/0375971 A1* 12/2021 Tayanaka ............ H01L 27/1462
2021/0379993 A1* 12/2021 Xu ....................... G02B 3/0006

FOREIGN PATENT DOCUMENTS

| TW | I-588981 B | 6/2017 |
| TW | I-619936 B | 4/2018 |
| TW | 201919222 A | 5/2019 |

\* cited by examiner

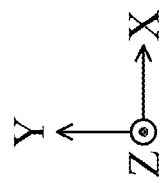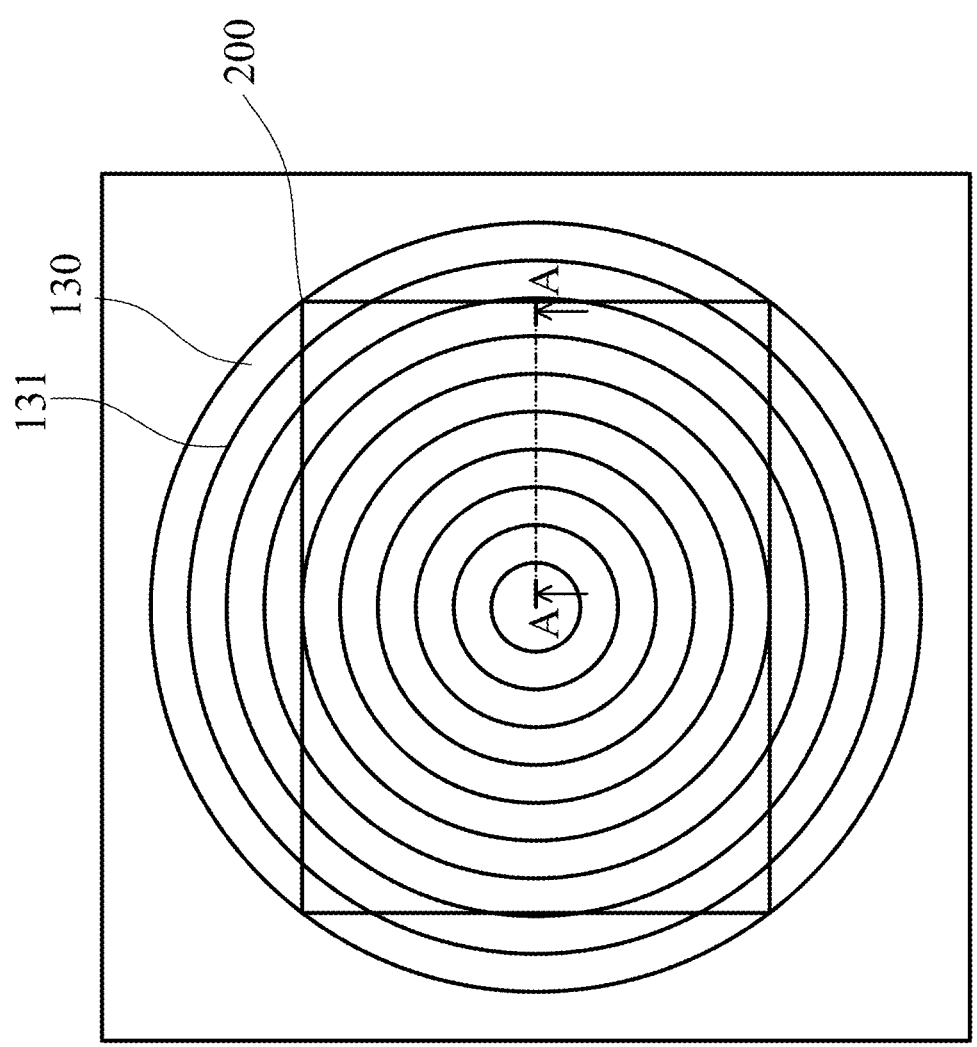
FIG. 2

IMAGE SENSING DEVICE WITH MULTIPLE OPTICAL LAYERS FORMED ON MICRO LENS

BACKGROUND

Field of the Disclosure

The present disclosure relates to an image sensing device, and in particular to an image sensing device including multiple optical layers formed on a micro lens.

Description of the Related Art

When the rays from the module lens of an electronic device enter an image sensing device, there will be a wide chief ray angle at the edge of the image sensing device. The color performance and image quality will be not satisfactory in a low light environment because the sensor (e.g. a photo diode) of the image sensing device cannot receive light efficiently. Therefore, finding a way to solve the above problem has become an important issue.

BRIEF SUMMARY

Some embodiments of the disclosure provide an image sensing device, including a micro lens, a first optical layer, a second optical layer, and an anti-reflection layer. The first optical layer is formed on the micro lens. The second optical layer is formed on the first optical layer. An interface is formed between the first optical layer and the second optical layer, and the interface is beveled. The anti-reflection layer is formed on the second optical layer.

For making the features and advantages (as described above) of the present disclosure more clear, or for other purposes, some embodiments are provided in the following paragraphs, and a subsequent detailed description is provided below with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 2 is a top view illustrating an image sensing device in accordance with some embodiments of the present disclosure.

DETAILED DESCRIPTION

The image sensing devices of some embodiments of the present disclosure are described in the following description. The specific embodiments disclosed are provided merely to clearly describe the usage of the present disclosure by some specific methods without limiting the scope of the present disclosure.

In addition, in this specification, relative expressions may be used. For example, "lower", "bottom", "higher" or "top" are used to describe the position of one element relative to another. It should be noted that if a device is flipped upside down, an element that is "lower" will become an element that is "higher."

It should be understood that, although the terms "first", "second," etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
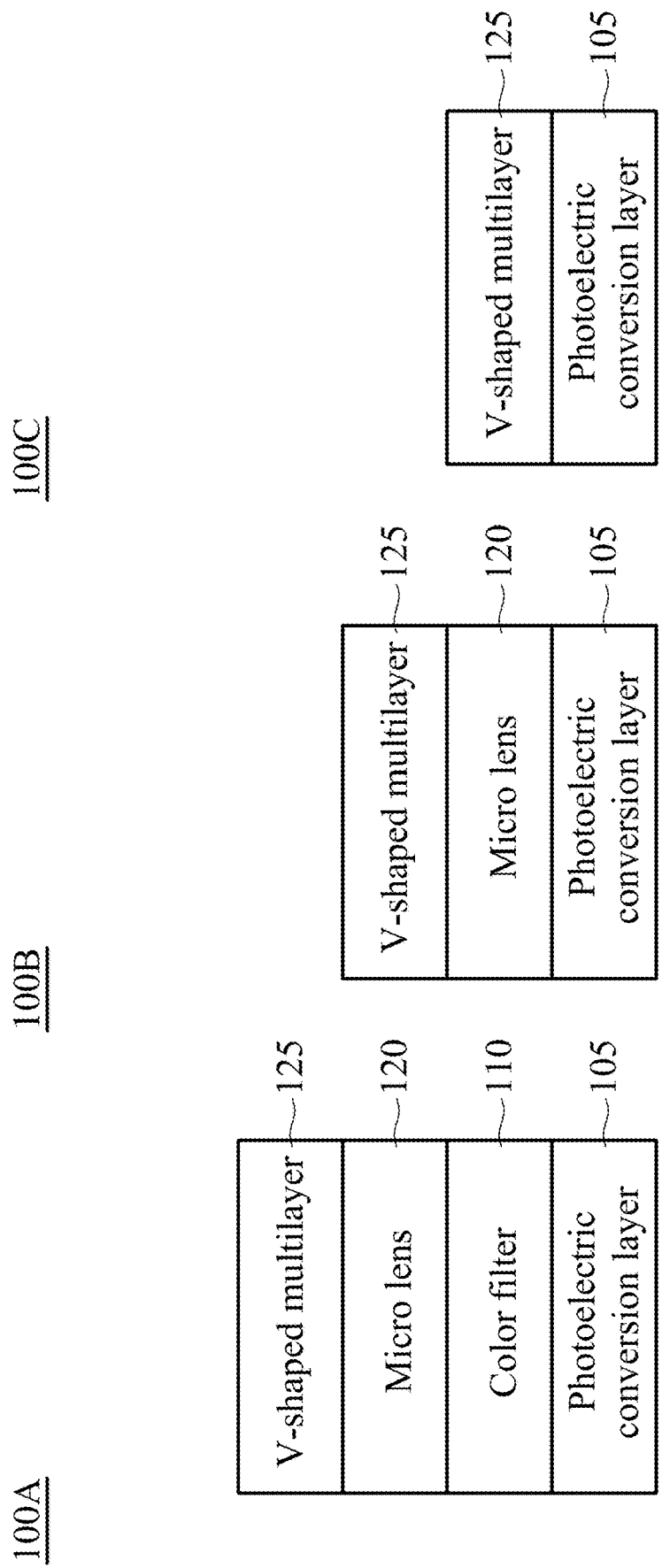
FIGS. 1A-1C are schematic views illustrating an image sensing device in accordance with some embodiments of the present disclosure.

FIGS. 1A-1C are schematic views illustrating an image sensing device in accordance with some embodiments of the present disclosure. As shown in FIG. 1A, an image sensing device 100A is provided and includes a photoelectric conversion layer 105, a color filter 110, a micro lens 120, and a V-shaped multilayer 125. The color filter 110 is formed on the photoelectric conversion layer 105, the micro lens 120 is formed on the color filter 110, and the V-shaped multilayer 125 is formed on the micro lens 120. However, the present disclosure is not limited thereto, and any of the color filter 110 and the micro lens 110 may be omitted. For example, as shown in FIG. 1B, the image sensing device 100B includes a photoelectric conversion layer 105, a micro lens 120, and a V-shaped multilayer 125. As shown in FIG. 1C, the image sensing device 100C includes a photoelectric conversion layer 105 and a V-shaped multilayer 125. The detailed structure of the photoelectric conversion layer 105, the color filter 110, the micro lens 120, and the V-shaped multilayer 125 may be further discussed as follows.

FIG. 2 is a top view illustrating an image sensing device 100 in accordance with some embodiments of the present disclosure. As shown in FIG. 2, an image sensing device 100 is provided and includes a first optical layer 130. In some embodiments, the first optical layer 130 is not flat, and includes multiple peaks 131. The peaks 131 are arranged concentrically about the center of the image sensing device 100. In the present embodiment, the image sensing device 100 includes a die region 200. The die region 200 is rectangular, and the vertexes of the die region 200 are located on the external edge of the first optical layer 130. The detailed structure of the image sensing device 100 will be discussed below in accompany with FIG. 2.

Figure 3:
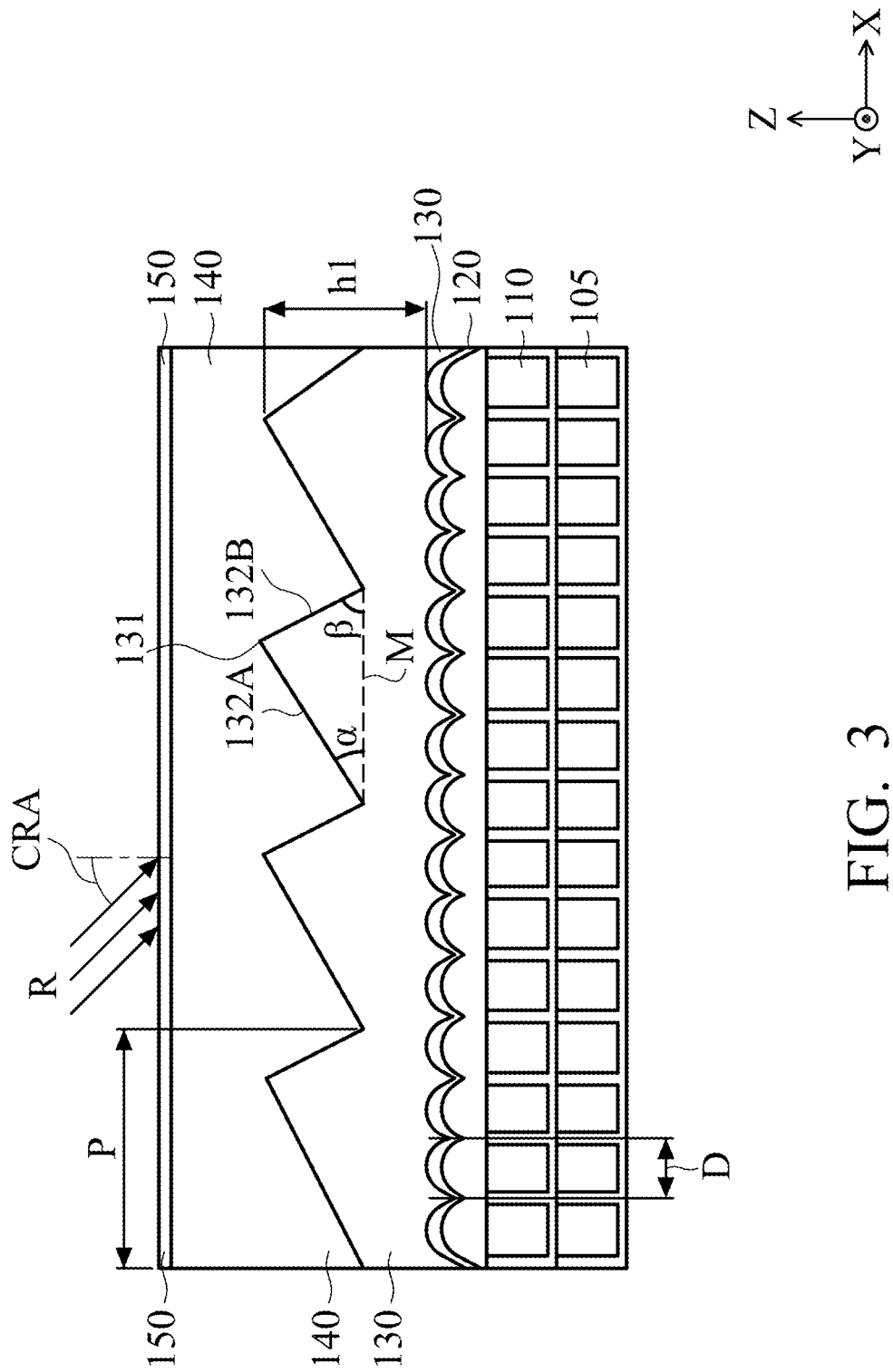
FIG. 3 is a cross-sectional view along line A-A shown in FIG. 2 in accordance with some embodiments of the present disclosure.

FIG. 3 is a cross-sectional view along line A-A shown in FIG. 2 in accordance with some embodiments of the present disclosure. As shown in FIG. 3, a plurality of micro lenses 120 are provided, wherein each of the micro lenses 120 has a convex surface, and a width D of the micro lens 120 is measure in the X-axis (i.e. in a horizontal direction). A color filter 110 is disposed under and corresponds to individual micro lens 120. A first optical layer 130 is formed on the micro lenses 120. In some embodiments, the first optical layer 130 fills the space between different micro lenses 120. For example, the material of the first optical layer 130 includes silicon oxide, silicon nitride, resin, polymer, transparent material (such as $BaF_2$, $CaF_2$, etc.), any other suitable material, or a combination thereof. In some embodiments, the first optical layer 130 is formed by spin-on coating, sputtering, photoresist coating, atomic layer deposition (ALD), plasma-enhanced chemical vapor deposition (PECVD), low-pressure chemical vapor deposition (LPCVD), high-density plasma chemical vapor deposition (HDP-CVD), any other suitable process, or a combination thereof. In some embodiments, the refractive index of the first optical layer 130 is in a range from about 1.0 to about 1.3, but the present disclosure is not limited thereto.

The first optical layer 130 includes at least one peak 131, a first facet 132A, and a second facet 132B. The first facet 132A and the second facet 132B intersect at the peak 131. In some embodiments, the first facet 132A and the second facet 132B form a V-shaped structure (or a tapered structure), such as the V-shaped multilayer 125 described above. Multiple V-shaped structures may be connected continuously, but the present disclosure is not limited thereto. In some embodiments, different V-shaped structures may be connected via a plane, a curved surface, any other suitable structure, or a combination thereof. In some embodiments, the slope of the first facet 132A is different from the slope of the second facet 132B. The height h1 is measured from the top of the micro lens 120 to the peak 131 of the first optical layer 120 in the Z axis (i.e. in the vertical direction). In some embodiments, the height h1 is 0.1 times to 300 times (such as 1 time, 10 times, 30 times, etc.) the width D of the micro lens 120. As shown in FIG. 3, a first angle α is formed between the first facet 132A and a reference plane M, and a second angle β is formed between the second facet 132B and a reference plane M. To be more specific, the first facet 132A, the second facet 132B and a reference plane M constitute a triangle, and the first angle α and the second angle β are interior angles of the triangle. In addition, a pitch P is defined as the width of the above triangle, which may also referred to as the length of the first facet 132A and the second facet 132B extending in the X-axis. In some embodiments, the pitch P is in a range from about 1 μm to about 300 μm.

In some embodiments, a second optical layer 140 is formed on the first optical layer 130. For example, the material of the first optical layer 130 includes silicon oxide ($SiO_2$), silicon nitride, $BaF_2$, $CaF_2$, MgO, BeO. $HfO_2$, $Ta_2O_5$, $TiO_2$, $MgF_2$, NaF, $SrF_2$, any other suitable material, or a combination thereof. In some embodiments, the refractive index of the second optical layer 140 is in a range from about 1.3 to about 2.5, but the present disclosure is not limited thereto. The refractive index of the second optical layer 140 is greater than the refractive index of the first optical layer 130. In the present embodiment, an interface is formed between the first optical layer 130 and the second optical layer 140, including the first facet 132A and the second facet 132B, and the interface is beveled. The second optical layer 140 may correspond to the first optical layer 130. To be more specific, the profile of the second optical layer 140 may match the profile of the first optical layer 130. As such, after the second optical layer 140 is formed on the first optical layer 130, the top surface of the second optical layer 140 is substantially flat (i.e. substantially parallel to the X-Y plane) for forming subsequent layer(s).

In some embodiments, the first angle α conforms to the following equation:

$$0° \leq \alpha \leq 2 \times \sin^{-1}\left(\frac{\sin CRA}{n}\right),$$

wherein CRA is the chief ray angle of the incident light R, which may be in a range from 0 degree to about 65 degree, and n is the refractive index of the second optical layer 140. In some embodiments, the first angle α conforms to the following equation $$0° \leq \alpha \leq 1.7 \times \sin^{-1}\left(\frac{\sin CRA}{n}\right).$$

In some embodiments, the first angle α conforms to the following equation:

$$0° \leq \alpha \leq 1.5 \times \sin^{-1}\left(\frac{\sin CRA}{n}\right).$$

The second angle β conforms to the following equation: $70°-\alpha \leq \beta \leq 90°$. In addition, the first angle α and the second angle β (i.e. the slopes of the first facet 132A and the second facet 132B) may be adjusted as required for collecting the incident light R into the sensor (not shown) of the image sensing device 100. Although the first angle α and the second angle β are constant in the present embodiment, they may also be changed according to the chief ray angle of the incident light R. In some embodiments, the first angle α gradually increases from the die's edge to the die's center in the die region 200. In some embodiments, the second angle β gradually decreases from the die's center to the die's edge in the die region 200.

Furthermore, an anti-reflection layer 150 is formed on the second optical layer 140. The anti-reflection layer 150 is configured to reduce the reflection of the incident light R and increase the light transmittance. As such, the sensibility of the sensor in the image sensing device 100 may be enhanced. The refractive index of the second optical layer 140 is different from the refractive index of the anti-reflection layer 150. In some embodiment, the refractive index of the second optical layer 140 is higher than the refractive index of the anti-reflection layer 150. The arrangement of the first optical layer 130, the second optical layer 140, and the anti-reflection layer 150 (such as the beveled interface between first optical layer 130 and the second optical layer 140) may help to reduce the chief ray angle of the incident light R (e.g. from the module lens of electronic devices), so that the sensor may receive the incident light R more efficiently, enhancing the sensibility of the sensor.

Figure 4:
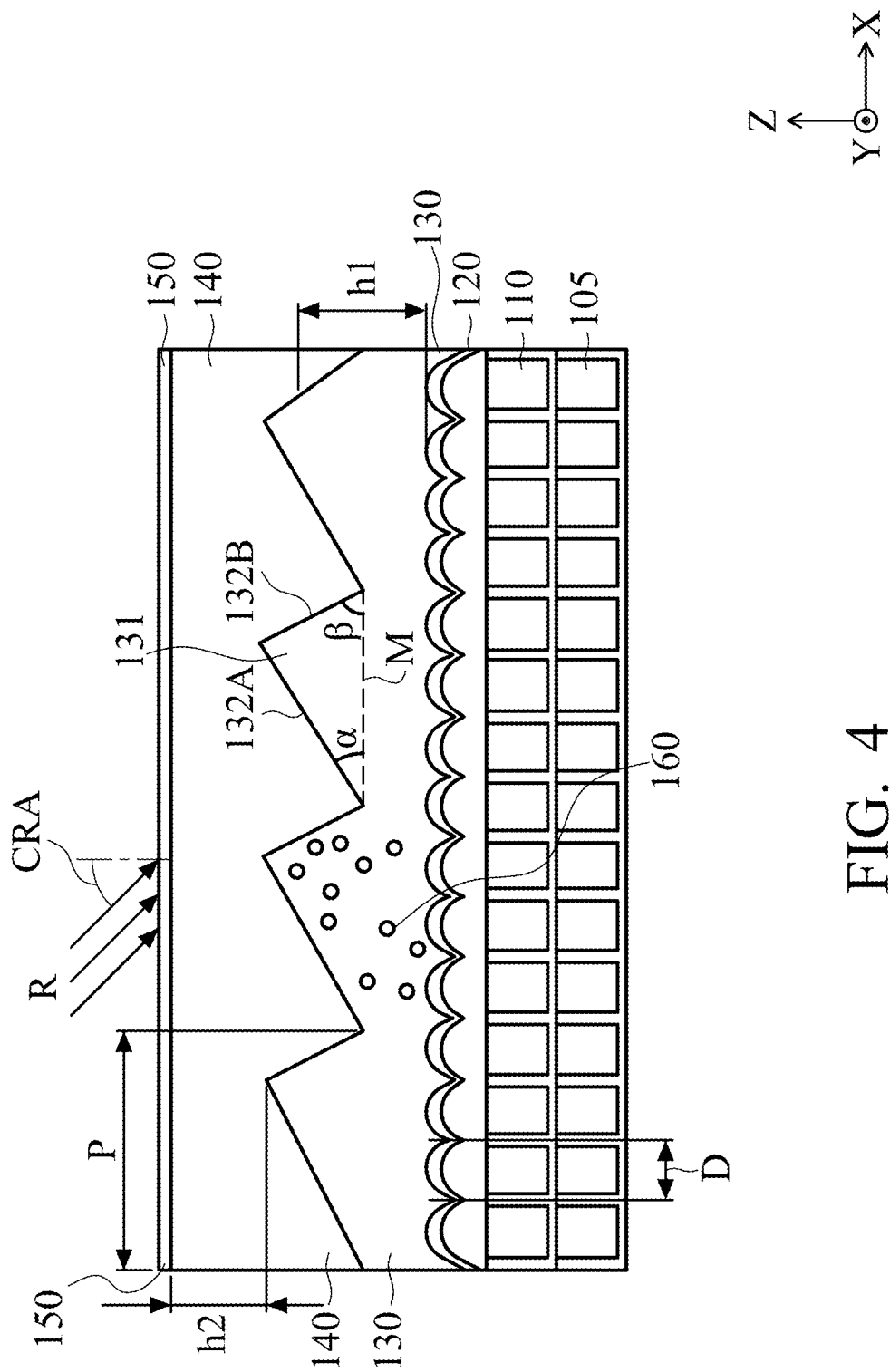
FIG. 4 is a cross-sectional view along line A-A shown in FIG. 2 in accordance with some other embodiments of the present disclosure.

FIG. 4 is a cross-sectional view along line A-A shown in FIG. 2 in accordance with some other embodiments of the present disclosure. It is noted that the image sensing device 100 in the present embodiment may include the same or similar elements, portions or layers as the image sensing device 100 shown in FIG. 3. Those elements, portions or layers are labeled as the same or similar numerals, and will not be discussed in detail again. The difference between the present embodiment and the embodiment shown in FIG. 3 is that a plurality of particles 160 are doped in the first optical layer 130. For example, the material of the particles 160 may include polymer material, such as polyamide, polyimide, polystyrene, polyethylene, polyethylene terephthalate, polyurethane, polycarbonate, poly(methyl methacrylate), any other suitable material, or a combination thereof. In some embodiments, air gap may be formed in the first optical layer 130.

In some embodiments, the refractive index of the particles 160 is less than the refractive index of the first optical layer 130, so as to adjust (e.g. reduce) the refractive index of the first optical layer 130. However, the present disclosure is not limited thereto. In some embodiments, the average diameter of the particles 160 is in a range from about 20 nm to about 200 nm. In addition, as shown in FIG. 4, the height h2 is measured from the peak of the first optical layer 130 to the bottom surface of the anti-reflection layer 150. In some embodiments, the height h2 may be greater than about 500 nm. By leaving the height h2 for forming the second optical layer 140, the planarization of the overall structure may be ensured so that the top surface of the image sensing device 100 remains flat and parallel to the X-Y plane.

Figure 5:
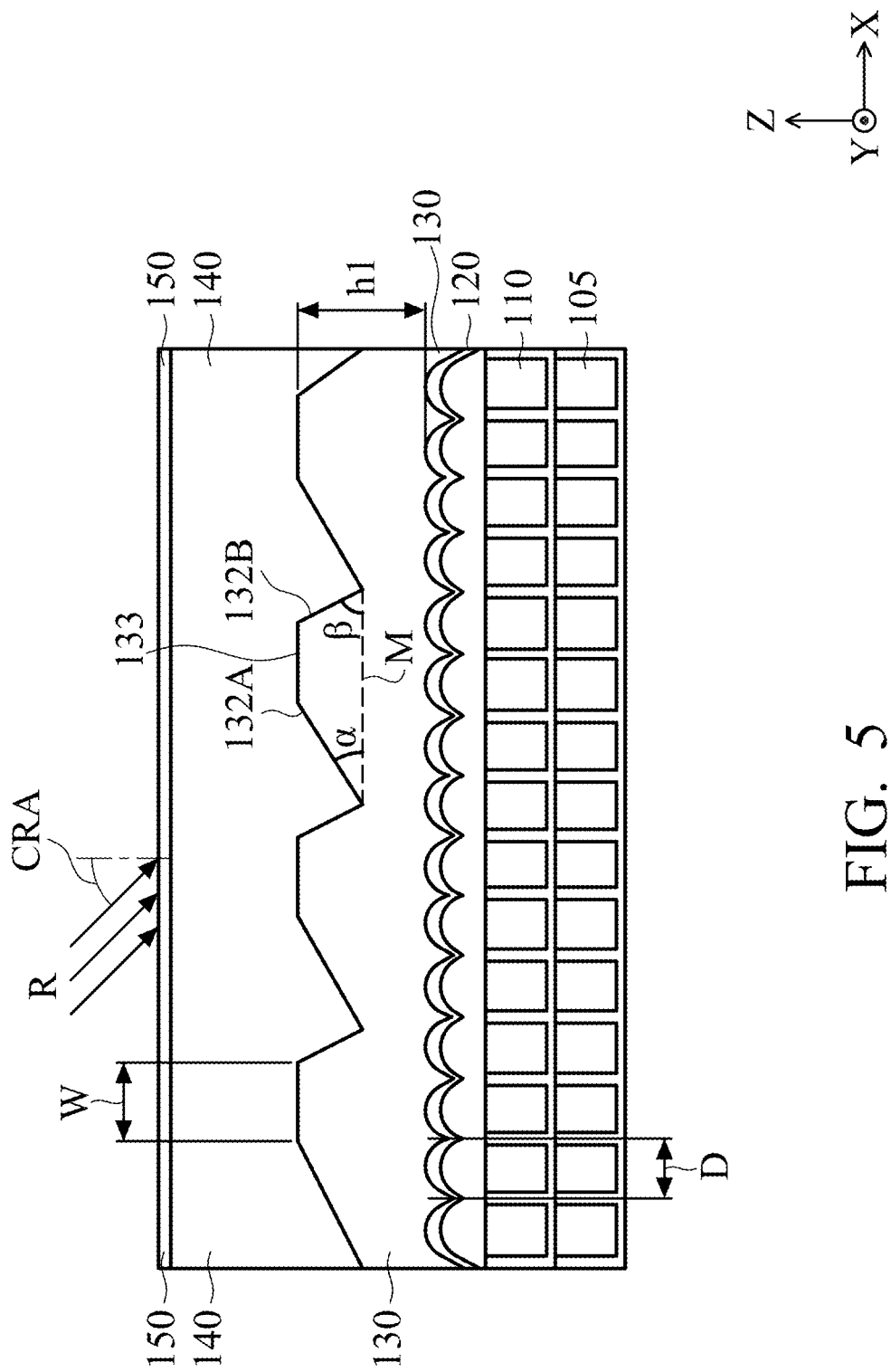
FIG. 5 is a cross-sectional view along line A-A shown in FIG. 2 in accordance with some other embodiments of the present disclosure.

FIG. 5 is a cross-sectional view along line A-A shown in FIG. 2 in accordance with some other embodiments of the present disclosure. It is noted that the image sensing device 100 in the present embodiment may include the same or similar elements, portions or layers as the image sensing device 100 shown in FIG. 3. Those elements, portions or layers are labeled as the same or similar numerals, and will not be discussed in detail again. The difference between the present embodiment and the embodiment shown in FIG. 3 is that a horizontal plane 133 is formed between the first facet 132A and the second facet 132B. The width W of the horizontal plane 133 may be adjusted based on the chief ray angle of the incident light R. In some embodiments, the width W of the horizontal plane 133 may be in a range from 0 to about half of the pitch P.

Figure 6:
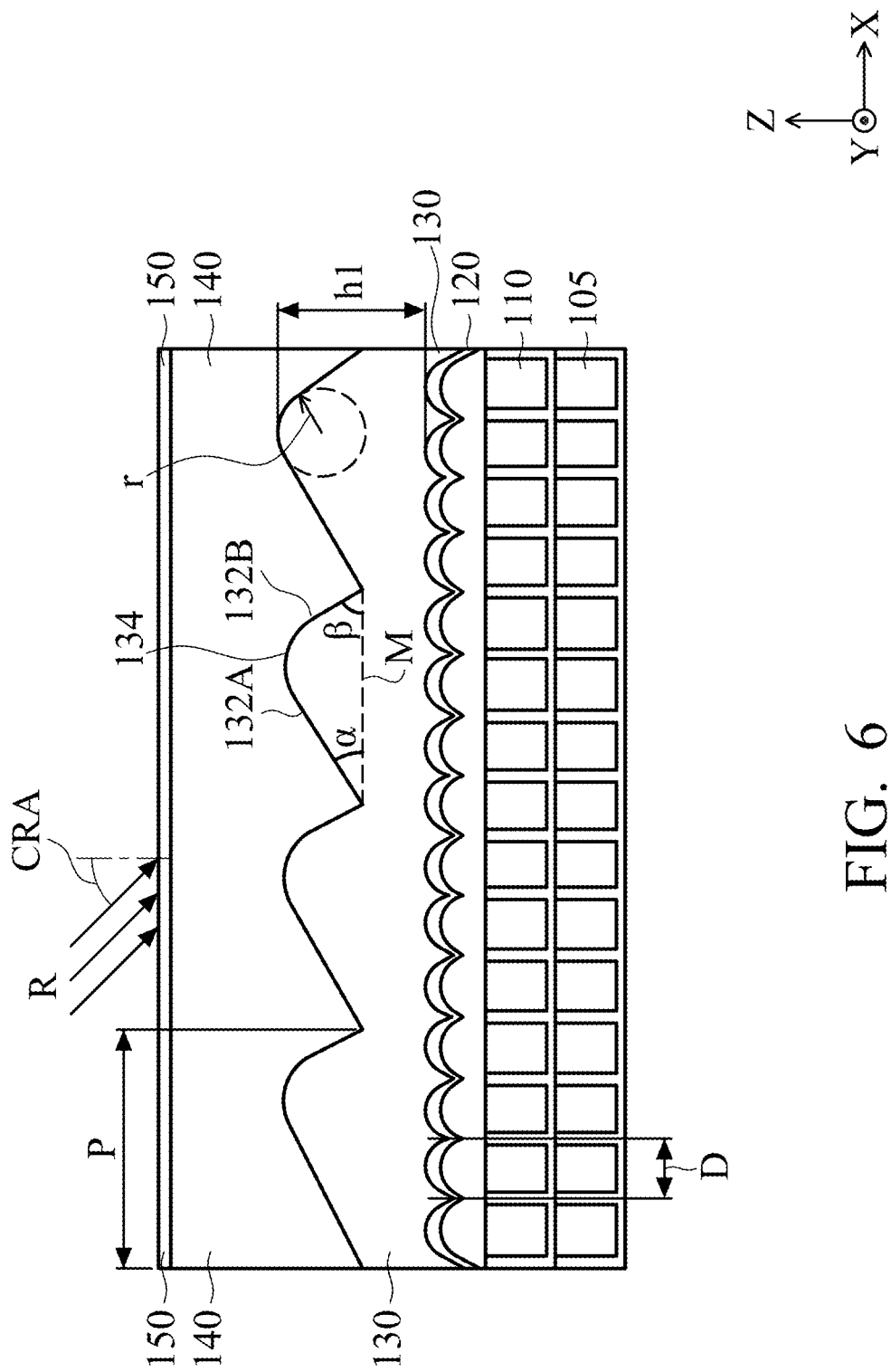
FIG. 6 is a cross-sectional view along line A-A shown in FIG. 2 in accordance with some other embodiments of the present disclosure.

FIG. 6 is a cross-sectional view along line A-A shown in FIG. 2 in accordance with some other embodiments of the present disclosure. It is noted that the image sensing device 100 in the present embodiment may include the same or similar elements, portions or layers as the image sensing device 100 shown in FIG. 3. Those elements, portions or layers are labeled as the same or similar numerals, and will not be discussed in detail again. The difference between the present embodiment and the embodiment shown in FIG. 3 is that a rounded structure 134 is formed between the first facet 132A and the second facet 132B. The radius of curvature r of the rounded structure 134 may be adjusted based on the chief ray angle of the incident light R. In some embodiments, the radius of curvature r of the rounded structure 134 may be not less than about 50 nm, but not greater than the width W.

Figure 7:
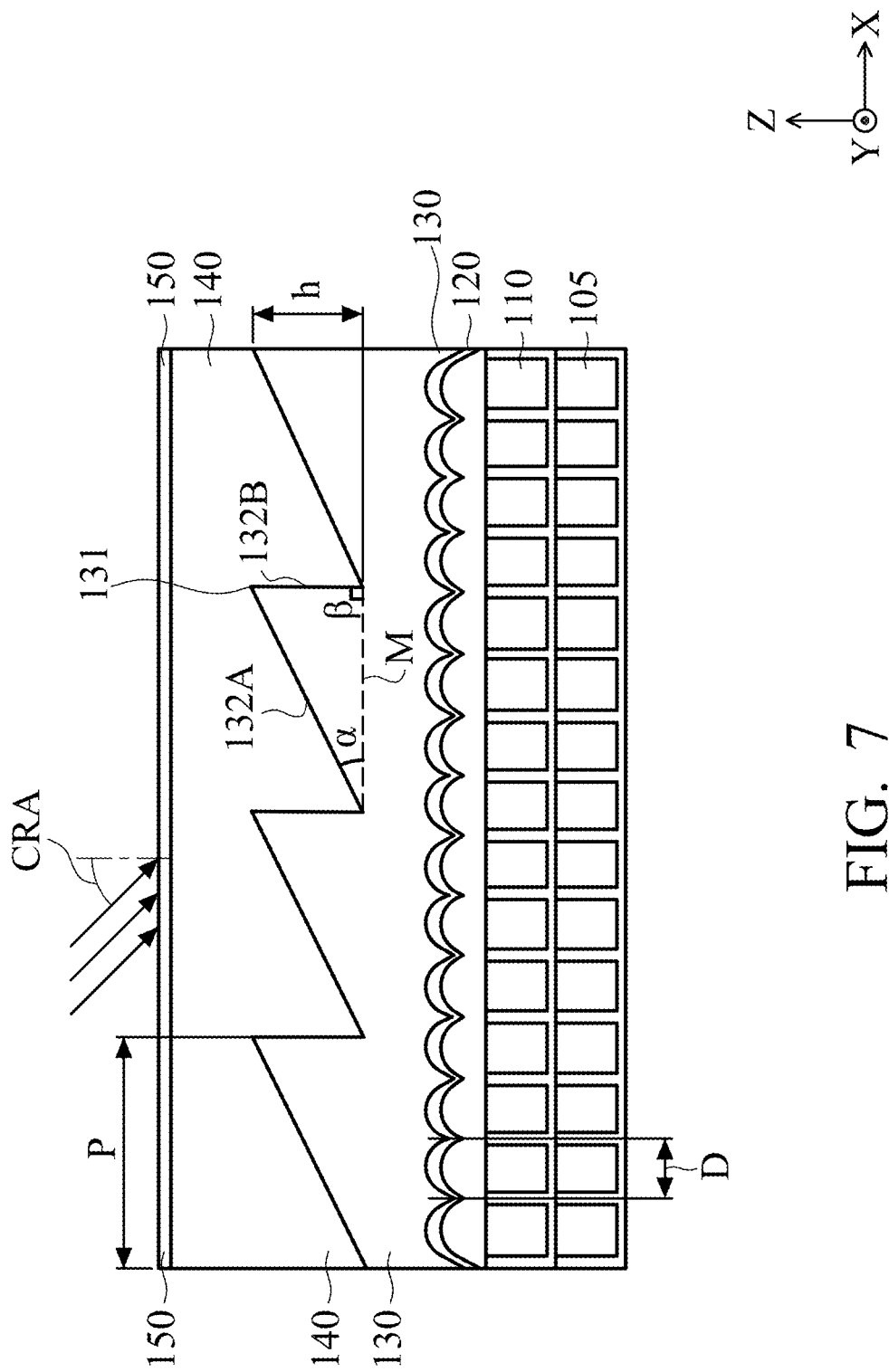
FIG. 7 a cross-sectional view along line A-A shown in FIG. 2 in accordance with some other embodiments of the present disclosure.

FIG. 7 a cross-sectional view along line A-A shown in FIG. 2 in accordance with some other embodiments of the present disclosure. It is noted that the image sensing device 100 in the present embodiment may include the same or similar elements, portions or layers as the image sensing device 100 shown in FIG. 3. Those elements, portions or layers are labeled as the same or similar numerals, and will not be discussed in detail again. The difference between the present embodiment and the embodiment shown in FIG. 3 is that the second angle R is 90 degrees, and the second facet 132B is perpendicular to the reference plane M. In the present embodiment, the first angle α may be in a range from about 0.5 degrees to about 50 degrees, such as 1 degree, 5 degrees, 10 degrees, 20 degrees, 30 degrees, 40 degrees, etc. The height h (which is the same as the length of the second facet 132B in the Z-axis) is in a range from about 0.3 μm to about 350 μm, such as 3 μm, 30 μm, 300 μm, etc.

Figure 8:
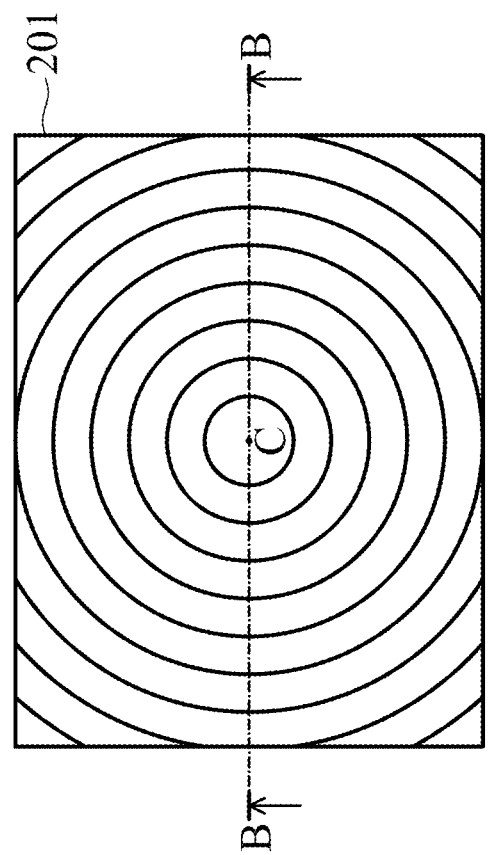
FIG. 8 is a top view illustrating a sensor die in accordance with some other embodiments of the present disclosure.
Figure 9A:
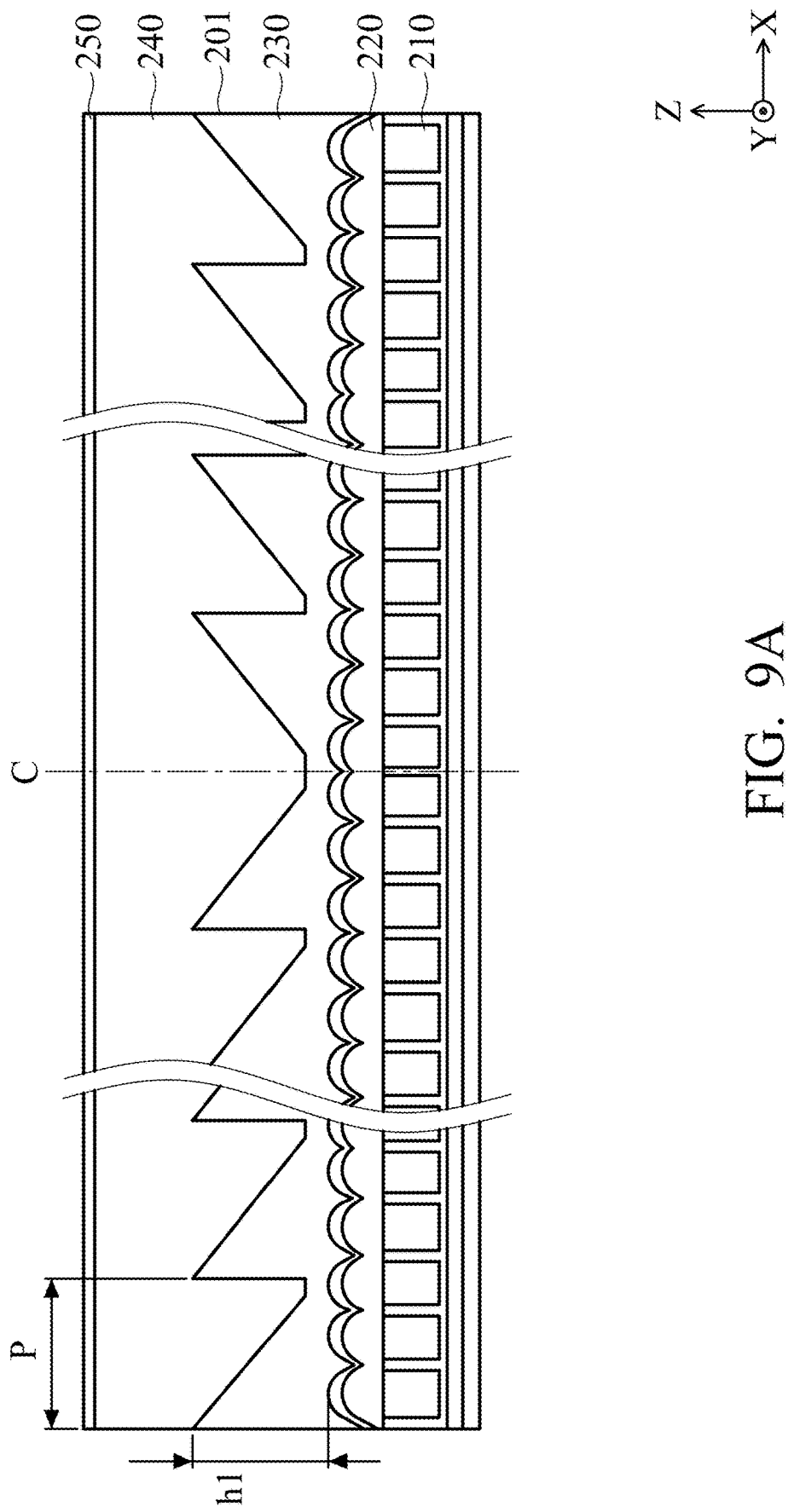
FIGS. 9A-9D are cross-sectional views along line B-B shown in FIG. 8 in accordance with some other embodiments of the present disclosure.
Figure 9B:
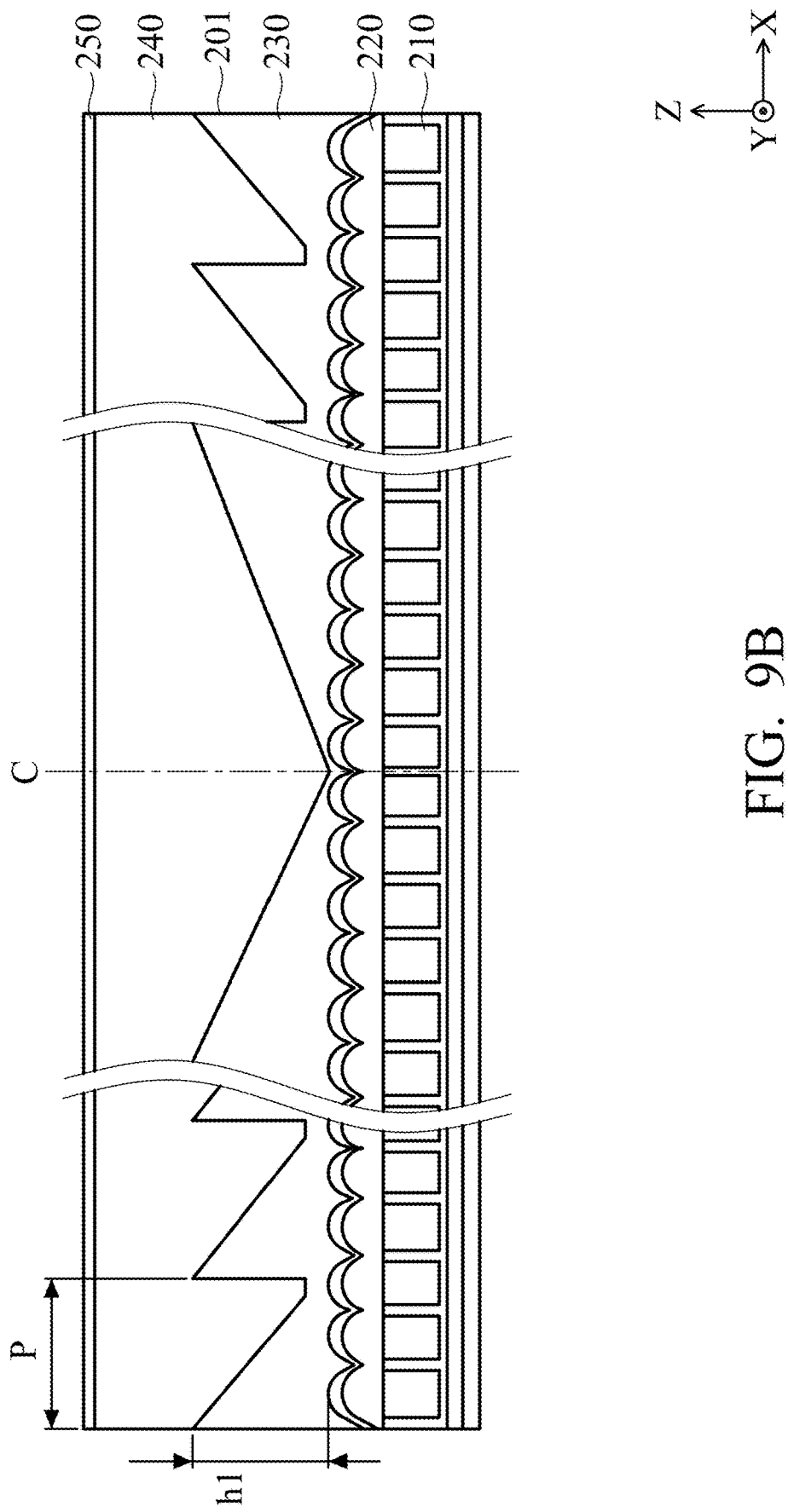
Figure 9C:
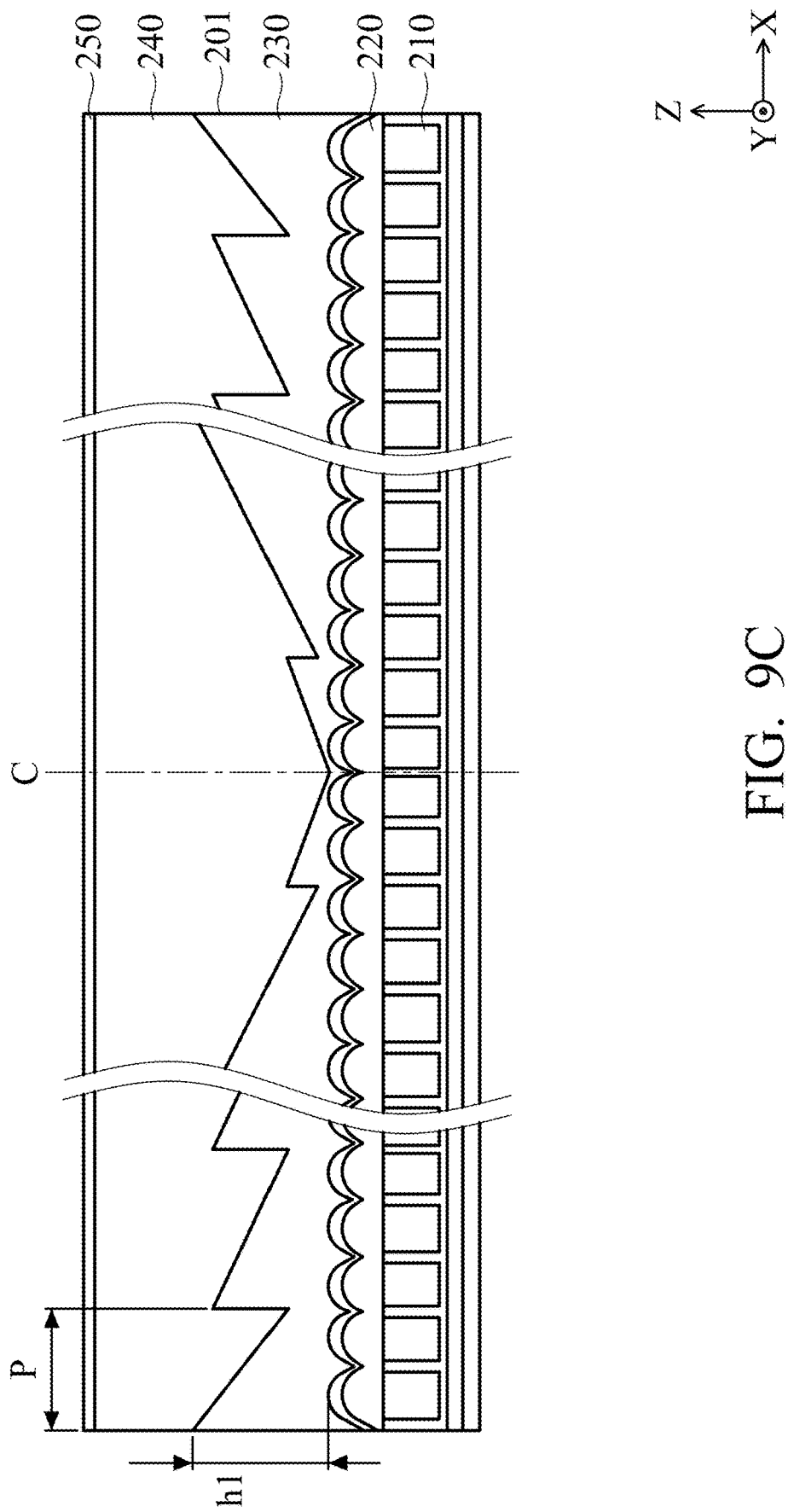

FIG. 8 is a top view illustrating a die region 200 in accordance with some other embodiments of the present disclosure. The die region 200 includes a die center C and a die edge 201. A line B-B passing through the die center C is illustrated. FIGS. 9A-9C are cross-sectional views along line B-B shown in FIG. 8 in accordance with some other embodiments of the present disclosure. It is noted that the die region 200 shown in the following embodiments may include the same or similar elements, portions or layers as the image sensing device 100 shown in FIG. 3. Those elements, portions or layers are labeled as the similar numerals, and will not be discussed in detail again. For example, the die region 200 includes a color filter 210 and a micro lens 220 formed on the color filter 210. The first optical layer 230 is formed on the micro lens 220. In addition, a second optical layer 240 is formed on the first optical layer 230, and an anti-reflection layer 250 is formed on the second optical layer 240.

As shown in FIG. 9A, the first optical layer 230 includes multiple V-shaped structures connected to each other, wherein the pitch P and the height h1 of the V-shaped structures are uniform across the whole die region 200. As shown in FIG. 9B, the height h1 of the V-shaped structures of the first optical layer 230 is uniform across the whole die region 200, while the pitch P of the V-shaped structures varies across the whole die region 200.

Figure 9D:
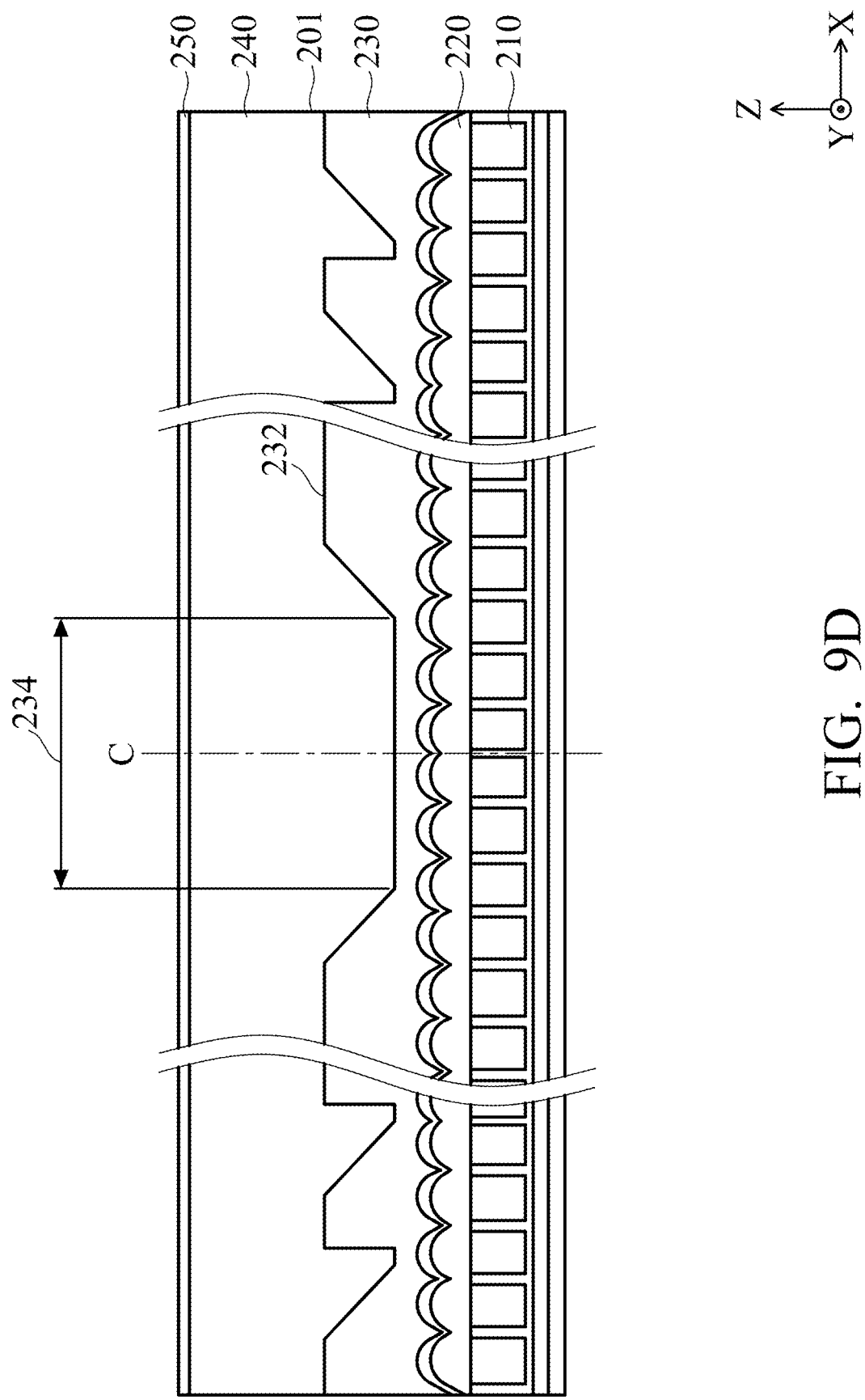

As shown in FIG. 9C, the height h1 of the V-shaped structures of the first optical layer 230 gradually decreases from the die edge 201 to the die center C, and the pitch P of the V-shaped structures still varies across the whole die region 200. As shown in FIG. 9D, a plane region 234 is formed around a die center C. To be more specific, no V-shaped structure is formed near the die center C, and a horizontal plane 232 is formed on the top of the first optical layer 230. It should be appreciated that these different configurations of the first optical layer 230 may be adopted according to the chief ray angle of the incident light.

Figure 10A:
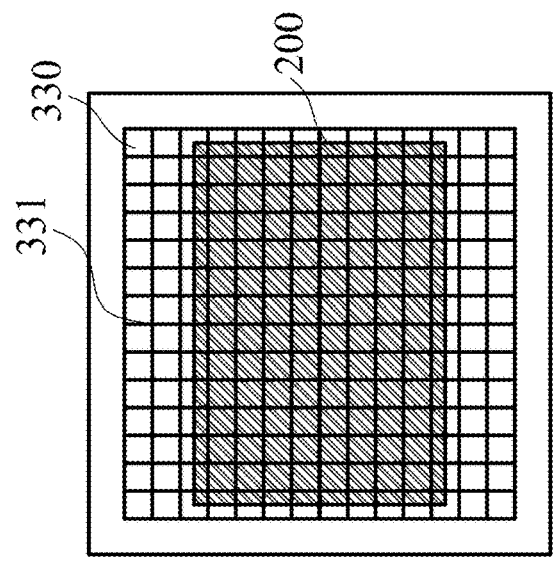
FIGS. 10A-10C are top views illustrating the image sensing device in accordance with some other embodiments of the present disclosure.
Figure 10B:
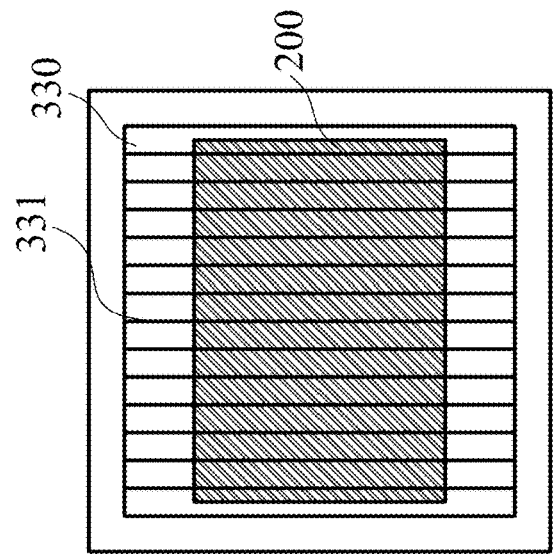
Figure 10C:
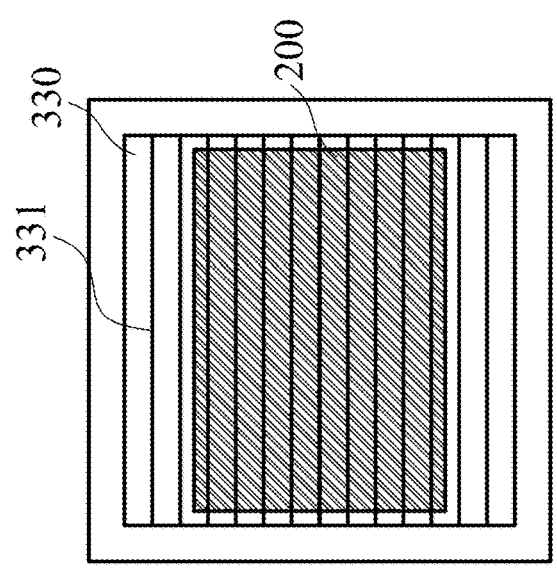

FIGS. 10A-10C are top views illustrating the image sensing device in accordance with some other embodiments of the present disclosure. As shown in FIG. 10A, the image sensing device 300A includes a first optical layer 330, wherein the peak 331 of the first optical layer 330 extends along the X-axis. That is, the V-shaped structures of the first optical layer 330 are arranged parallel to the X-axis. As shown in FIG. 10B, in the image sensing device 300B, the peak 331 of the first optical layer 330 extends along the Y-axis, and the V-shaped structures of the first optical layer 330 are arranged parallel to the Y-axis.

In some embodiments, as shown in FIG. 10C, the image sensing device 300C includes a plurality of first optical layers 330 and a plurality of second optical layers (not shown in the present embodiment) alternatively stacked.

More specifically, one of the second optical layers is formed between the first optical layers 330, and the other of the second optical layers is formed between one of the first optical layers and the anti-reflection layer (not shown in the present embodiment). The peak 331 of one of the first optical layers 330 extends along the X-axis, and the peak 331 of the other of the first optical layers 330 extends along the Y-axis. It should be appreciated that these different configurations of the first optical layer 330 may be adopted as required.

As set forth above, the embodiments of the present disclosure provide an image sensing device including multiple optical layers formed on a micro lens. A beveled interface or a V-shaped structure is formed between first optical layer and the second optical layer, which may help to reduce the chief ray angle of the incident light (e.g. from the module lens of electronic devices), so that the sensor may receive the incident light more efficiently, enhancing the sensibility of the sensor.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An image sensing device, comprising:
    a photoelectric conversion layer;
    a micro lens formed on the photoelectric conversion layer;
    a first optical layer formed on the micro lens;
    a second optical layer formed on the first optical layer, wherein the first optical layer directly contacts the second optical layer to form an interface between the first optical layer and the second optical layer, the interface is beveled, and a top surface of the second optical layer is substantially flat; and
    an anti-reflection layer formed on the second optical layer.

2. The image sensing device as claimed in claim 1, wherein a refractive index of the first optical layer is different from a refractive index of the second optical layer, and
    wherein the refractive index of the second optical layer is in a range from about 1.3 to about 2.5.

3. The image sensing device as claimed in claim 1, wherein a refractive index of the first optical layer is different from a refractive index of the second optical layer, and
    wherein the refractive index of the first optical layer is less than the refractive index of the second optical layer, and the refractive index of the first optical layer is not less than 1.

4. The image sensing device as claimed in claim 1, wherein the interface between the first optical layer and the second optical layer is V-shaped.

5. The image sensing device as claimed in claim 1, further comprising:
    a plurality of first optical layers; and
    a plurality of second optical layers, wherein one of the second optical layers is formed between the first optical layers, and the other of the second optical layers is formed between one of the first optical layers and the anti-reflection layer.

6. The image sensing device as claimed in claim 1, wherein a height from a top of the micro lens to a peak of the first optical layer is 0.1 times to 300 times a width of the micro lens.

7. The image sensing device as claimed in claim 6, wherein the peak is concentrically arranged about a center of the image sensing device.

8. The image sensing device as claimed in claim 6, wherein the peak is arranged in a horizontal direction or in a vertical direction.

9. The image sensing device as claimed in claim 1, wherein the first optical layer comprises a first facet and a second facet intersecting with the first facet, wherein a slope of the first facet is different from a slope of the second facet.

10. The image sensing device as claimed in claim 9, wherein a first angle is formed between the first facet and a reference plane, a second angle is formed between the second facet and the reference plane, and the first angle is different from the second angle.

11. The image sensing device as claimed in claim 10, wherein the first angle gradually increases from a die edge to a die center.

12. The image sensing device as claimed in claim 10, wherein the second angle gradually decreases from a die center to a die edge.

13. The image sensing device as claimed in claim 9, wherein a horizontal plane is formed between the first facet and the second facet.

14. The image sensing device as claimed in claim 9, wherein a rounded structure is formed between the first facet and the second facet.

15. The image sensing device as claimed in claim 9, wherein a pitch is defined as a length of the first facet and the second facet that extend in a horizontal direction, and the pitch varies across a die region.

16. The image sensing device as claimed in claim 1, wherein the first optical layer has a plane region formed around a die center.

17. The image sensing device as claimed in claim 1, further comprising a plurality of particles doped in the first optical layer, wherein a refractive index of the particles is less than a refractive index of the first optical layer.

18. The image sensing device as claimed in claim 1, further comprising a color filter disposed under the micro lens.

19. The image sensing device as claimed in claim 1, wherein the beveled interface is V-shaped.

20. The image sensing device as claimed in claim 1, wherein a profile of the first optical layer matches a profile of the second optical layer.

* * * * *